United States Patent
Park et al.

(10) Patent No.: US 7,675,786 B2
(45) Date of Patent: Mar. 9, 2010

(54) METHOD OF OPERATING A SEMICONDUCTOR MEMORY DEVICE HAVING A RECESSED CONTROL GATE ELECTRODE

(75) Inventors: Sang-jin Park, Yongin-si (KR); In-jun Hwang, Yongin-si (KR); Jae-woong Hyun, Uijeongbu-si (KR); Yoon-dong Park, Yongin-si (KR); Kwang-soo Seol, Suwon-si (KR); Sang-min Shin, Seoul (KR); Sang-moo Choi, Yongin-si (KR); Ju-hee Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 70 days.

(21) Appl. No.: 11/898,709

(22) Filed: Sep. 14, 2007

(65) Prior Publication Data
US 2008/0094917 A1  Apr. 24, 2008

(30) Foreign Application Priority Data
Oct. 19, 2006  (KR)  .................... 10-2006-0102040

(51) Int. Cl.
*G11C 16/04*  (2006.01)
(52) U.S. Cl. ..................... 365/185.28; 365/185.18; 365/185.27
(58) Field of Classification Search ............ 365/185.28, 365/185.27, 185.18, 185.29
See application file for complete search history.

(56) References Cited

U.S. PATENT DOCUMENTS

| | | | | |
|---|---|---|---|---|
| 5,923,978 A * | 7/1999 | Hisamune | .................... | 438/264 |
| 5,929,480 A * | 7/1999 | Hisamune | .................... | 257/320 |
| 6,483,750 B2 * | 11/2002 | Dallabora et al. | ...... | 365/185.23 |
| 6,720,611 B2 * | 4/2004 | Jang | .......................... | 257/315 |
| 6,914,820 B1 * | 7/2005 | Wong | .................... | 365/185.18 |
| 7,129,538 B2 * | 10/2006 | Lee et al. | .................... | 257/321 |
| 2008/0175061 A1 * | 7/2008 | Kim et al. | ............. | 365/185.18 |
| 2008/0191264 A1 * | 8/2008 | Kim et al. | .................... | 257/319 |

* cited by examiner

*Primary Examiner*—Tuan T Nguyen
*Assistant Examiner*—Hien N Nguyen
(74) *Attorney, Agent, or Firm*—Harness, Dickey & Pierce, P.L.C.

(57) ABSTRACT

A semiconductor memory device may include a semiconductor substrate, a control gate electrode recessed in the semiconductor substrate, a storage node layer between the control gate electrode and the semiconductor substrate, a tunneling insulating layer between the storage node layer and the semiconductor substrate, a blocking insulating layer between the storage node layer and the control gate electrode, and first and second channel regions surrounding the control gate electrode and separated by a pair of opposing separating insulating layers. A method of operating the semiconductor memory device may include programming data in the storage node layer by charge tunneling through the blocking insulating layer, thus achieving relatively high reliability and efficiency.

20 Claims, 6 Drawing Sheets

METHOD OF OPERATING A SEMICONDUCTOR MEMORY DEVICE HAVING A RECESSED CONTROL GATE ELECTRODE

PRIORITY STATEMENT

This application claims priority under 35 U.S.C. § 119 to Korean Patent Application No. 10-2006-0102040, filed on Oct. 19, 2006 in the Korean Intellectual Property Office (KIPO), the entire contents of which are incorporated herein by reference.

BACKGROUND

1. Technical Field

Example embodiments relate to a semiconductor memory device having a recessed control gate electrode.

2. Description of the Related Art

Semiconductor memory devices have become more integrated and faster in operation in response to the recent trend toward smaller and faster devices in the semiconductor industry. For example, three-dimensional (3-D) semiconductor memory devices have been introduced as alternatives to conventional planar semiconductor memory devices. A 3-D semiconductor memory device may include a control gate electrode recessed in a semiconductor substrate.

3-D nonvolatile semiconductor memory devices may have higher channel areas and operating currents than conventional planar semiconductor memory devices. The higher operating currents may result in increases in the speeds of the 3-D semiconductor memory devices. However, unit cells of the 3-D semiconductor memory devices may occupy relatively large areas and operate at a one bit level, thus presenting obstacles to increasing the integration density of the 3-D semiconductor memory devices.

Additionally, source and drain regions of the 3-D semiconductor memory devices may also occupy relatively large areas. For example, negative AND (NAND) type semiconductor memory devices may be configured such that the source and drain regions are alternately arranged, thus occupying relatively large areas and limiting integration density. Furthermore, the distribution of the electric field density of the 3-D semiconductor memory devices may not be uniform, thus decreasing efficiency and reliability in the programming and erasing operations.

SUMMARY OF EXAMPLE EMBODIMENTS

Example embodiments provide a method of operating a three-dimensional (3-D) semiconductor memory device having higher reliability and efficiency. A method of operating a semiconductor memory device may include providing a semiconductor memory device having a semiconductor substrate, a control gate electrode recessed in the semiconductor substrate, a storage node layer between the control gate electrode and the semiconductor substrate, a tunneling insulating layer between the storage node layer and the semiconductor substrate, a blocking insulating layer between the storage node layer and the control gate electrode, and/or first and second channel regions surrounding the control gate electrode and separated by a pair of opposing separating insulating layers; and programming data in the storage node layer by charge tunneling through the blocking insulating layer. Programming the data may include applying a negative program voltage to the control gate electrode. Applying the negative program voltage may include grounding one of the first and second channel regions and optionally applying a channel boosting voltage to the channel region that is not grounded. The method of operating a semiconductor memory device may further include erasing the data programmed in the storage node layer by charge tunneling through the blocking insulating layer. Erasing the data may include applying a positive erase voltage to the control gate electrode.

The semiconductor memory device may further include a buried insulating layer between the bottom of the control gate electrode and the semiconductor substrate. The buried insulating layer may have a thickness greater than the thickness of the tunneling insulating layer. The control gate electrode may have a cylindrical shape but is not limited thereto. The tunneling insulating layer may have a dielectric constant about equal to or greater than the dielectric constant of the blocking insulating layer.

A method of operating a semiconductor memory device may also include providing a semiconductor memory device having a semiconductor substrate, a plurality of control gate electrodes recessed in the semiconductor substrate, a plurality of storage node layers between the plurality of control gate electrodes and the semiconductor substrate, a plurality of tunneling insulating layers between the plurality of storage node layers and the semiconductor substrate, wherein adjacent tunneling insulating layers contact each other, a plurality of blocking insulating layers between the plurality of storage node layers and the plurality of control gate electrodes, and/or first and second channel regions surrounding the plurality of control gate electrodes; and programming data in the plurality of storage node layers by charge tunneling through the plurality of blocking insulating layers.

DETAILED DESCRIPTION OF EXAMPLE EMBODIMENTS

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Example embodiments may be described more fully with reference to the accompanying drawings. Example embodiments may, however, be embodied in different forms and should not be construed as limited to examples set forth herein. In the drawings, the sizes of the components may have been exaggerated for clarity.

Semiconductor memory devices according to example embodiments may have a three-dimensional (3-D) structure. For example, semiconductor memory devices may include a control gate electrode recessed or trenched in a semiconductor substrate. Accordingly, the control gate electrode may be referred to as a recessed control gate electrode or a trenched control gate electrode, although the scope of the present specification is not limited to the term. Additionally, the semiconductor memory devices according to example embodiments may include nonvolatile memory devices (e.g., flash memory devices).

Figure 1:
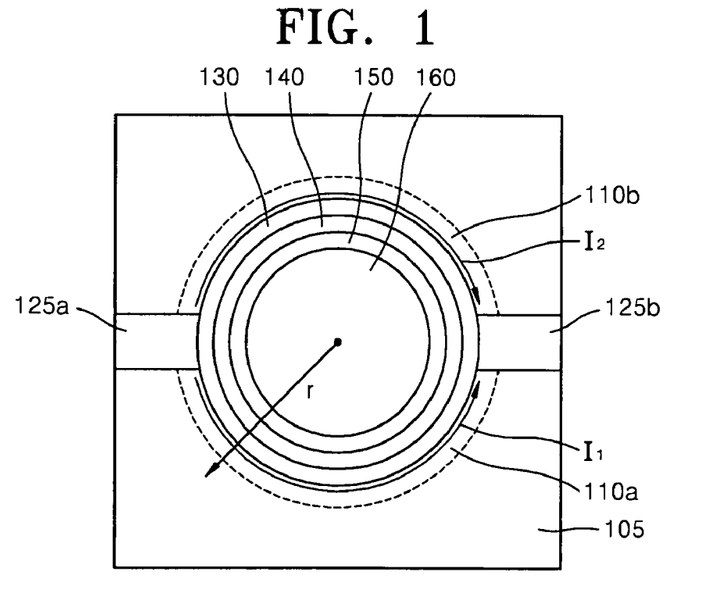
FIG. 1 is a plan view of a semiconductor memory device according to example embodiments.
Figure 2:
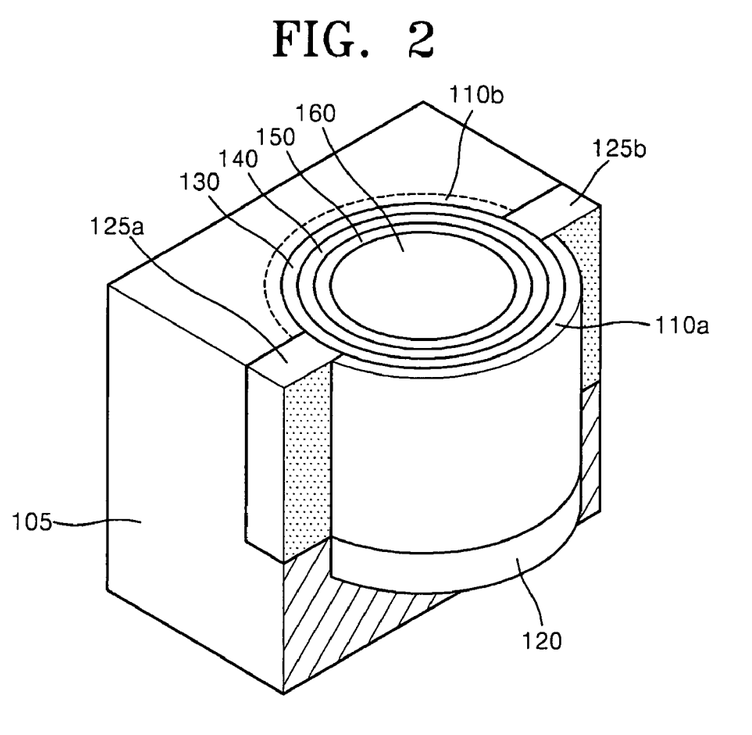
FIG. 2 is a partial cutaway perspective view of the semiconductor memory device of FIG. 1.

FIG. 1 is a plan view of a semiconductor memory device according to example embodiments. FIG. 2 is a partial cutaway perspective view of the semiconductor memory device of FIG. 1. The semiconductor memory device of FIGS. 1 and 2 may be, for example, a unit cell of a flash memory device. Referring to FIGS. 1 and 2, the semiconductor memory device having a 3-D structure may include a semiconductor substrate 105, first and second channel regions 110a and 110b, respectively, a tunneling insulating layer 130, a storage node layer 140, a blocking insulating layer 150, and a control gate electrode 160. The semiconductor memory device may control the pair of channel regions 110a and 110b using the control gate electrode 160. The channel regions 110a and 110b may be separated from each other by a pair of separating insulating layers 125a and 125b. The semiconductor memory device may optionally include a buried insulating layer 120.

The semiconductor substrate 105 may include a bulk semiconductor wafer, e.g., a silicon wafer, a germanium wafer, or a silicon-germanium wafer. The semiconductor substrate 105 may further include an epitaxial layer on the bulk semiconductor wafer.

The control gate electrode 160 may be recessed in the semiconductor substrate 105. For example, the control gate electrode 160 may be formed by providing a hole (not shown) in the semiconductor substrate 105 and filling the hole with a conductive layer. The control gate electrode 160 may include polysilicon, metal, or metal silicide. The control gate electrode 160 may have a cylindrical shape and may induce a symmetrical, radial electric field. Current density may decrease as the distance r from the center of the control gate electrode 160 increases. Consequently, the radial electric field may also decrease as the distance r from the center of the control gate electrode 160 increases. Additionally, this electric field reduction may increase as the radius of the control gate electrode 160 decreases. A change in the radial electric field (as opposed to the constant electric field of a planar semiconductor memory device) may affect the operation of the semiconductor memory device significantly.

While the control gate electrode 160 may have a circular cylindrical shape in FIGS. 1 and 2, example embodiments are not limited thereto. The control gate electrode 160 may have various shapes, including an elliptical cylindrical shape or a polygonal cylindrical shape. However, a uniform radial electric field may be more difficult to achieve when the control gate electrode 160 has an elliptical or polygonal cylindrical shape. Nevertheless, in such a case, it may be beneficial for the control gate electrode 160 to be symmetrical about a line connecting the separating insulating layers 125a and 125b.

The storage node layer 140 may be interposed between a sidewall of the control gate electrode 160 and the semiconductor substrate 105. The storage node layer 140 may be used as a charge storage medium. For example, the storage node layer 140 may include a polysilicon layer, a silicon nitride layer, metal and/or silicon dots, and/or metal and/or silicon nano-crystals. The storage node layer 140, including the silicon nitride layer, the metal and/or silicon dots, and/or the metal and/or silicon nano-crystals, may be used as a local charge trap layer.

The tunneling insulating layer 130 may be interposed between the storage node layer 140 and the semiconductor substrate 105. The blocking insulating layer 150 may be interposed between the storage node layer 140 and the control gate electrode 160 so as to insulate the storage node layer 140 and the control gate electrode 160. The tunneling insulating layer 130, the storage node layer 140, and the blocking insulating layer 150 may be formed along the sidewall of the control gate electrode 160. Thus, the blocking insulating layer 150 may surround the control gate electrode 160, the storage node layer 140 may surround the blocking insulating layer 150, and the tunneling insulating layer 130 may surround the storage node layer 140. Accordingly, each of the tunneling insulating layer 130, the storage node layer 140, and the blocking insulating layer 150 may have a hollow, cylindrical shape.

The pair of channel regions 110a and 110b may surround the control gate electrode 160. The channel regions 110a and 110b may be separated by a pair of opposing separating insulating layers 125a and 125b. For example, the first channel region 110a may be disposed on one side of the separating insulating layers 125a and 125b, while the second channel region 110b may be disposed on the other side of the separating insulating layers 125a and 125b. The separating insulating layers 125a and 125b may be connected to the tunneling insulating layer 130 and may include an oxide layer, a nitride layer, and/or a dielectric layer having a high-dielectric constant (k).

A buried insulating layer 120 may be optionally interposed between the bottom of the control gate electrode 160 and the semiconductor substrate 105. The buried insulating layer 120 may have a thickness greater than the thickness of each of the tunneling insulating layer 130 and the blocking insulating layer 150 so as to prevent or reduce the formation of a channel on the bottom of the semiconductor substrate 105. Accordingly, the first and second channel regions 110a and 110b are not connected, even through the bottom of the semiconductor substrate 105.

A method of operating the semiconductor memory device of FIGS. 1 and 2 may be provided below. The first and second channel regions 110a and 110b may be used as bit lines, and the control gate electrode 160 may be used as a common word line. A first current $I_1$ may flow through the first channel region 110a, and a second current $I_2$ may flow through the second channel region 110b. Data programming and erasing operations may be performed by controlling the bit lines and the word line and allowing charges to tunnel through the blocking insulating layer 150. Charge tunneling through the blocking insulating layer 150 may be comparable to charge tunneling through the tunneling insulating layer 130. Accordingly, the tunneling insulating layer 130 and the blocking insulating layer 150 may be interchanged with each other in FIGS. 1 and 2.

Data may be programmed in the storage node layer 140 by charge tunneling through the blocking insulating layer 150. Similarly, data programmed in the storage node layer 140 may be erased by charge tunneling through the blocking insulating layer 150. Data may be programmed or erased by moving electrons or holes in a first direction from the control gate electrode 160 to the storage node layer 140 or in a second direction opposite to the first direction through the blocking insulating layer 150 using Fowler-Nordheim (F-N) tunneling.

Charge tunneling through the blocking insulating layer 150 may be more beneficial than charge tunneling through the tunneling insulating layer 130 due to the electric field distribution characteristics of a 3-D semiconductor memory device. Because an electric field decreases as the distance r from the center of the control gate electrode 160 increases when a voltage is applied to the control gate electrode 160, a higher electric field may be induced in the blocking insulating layer 150 than in the tunneling insulating layer 130. Thus, the electric field distribution of a 3-D semiconductor memory device may be different from the constant electric field of a planar semiconductor memory device having the same material.

To perform the programming and erasing operations using the blocking insulating layer 150, it may be beneficial for the dielectric constant of the tunneling insulating layer 130 be equal to or greater than the dielectric constant of the blocking insulating layer 150. For example, the blocking insulating layer 150 may include a silicon oxide layer, and the tunneling insulating layer 130 may include a silicon oxide layer, a silicon nitride layer, and/or a high-k dielectric layer. The high-k dielectric layer may include an aluminum oxide layer, a tantalum oxide layer, a titanium oxide layer, a hafnium oxide layer, and/or a niobium oxide layer. The high-k dielectric layer may have a dielectric constant greater than the dielectric constant of the silicon nitride layer.

While the storage node layer 140 may have a single annular shape, portions of the storage node layer 140 facing the first and second channel regions 110a and 110b may be local charge storage layers. Accordingly, the semiconductor memory device may process 2-bit data in a single level operation.

The programming operation may be performed by applying a negative program voltage to the control gate electrode 160. One of the first and second channel regions 110a and 110b (e.g., first channel region 110a) may be grounded such that charges may tunnel from the control gate electrode 160 to the storage node layer 140 at the side of the first channel region 110a through the blocking insulating layer 150. A channel boosting voltage may be optionally applied to the channel region that is not grounded (e.g., second channel region 110b) such that charges may be prevented from tunneling from the control gate electrode 160 to the second channel region 110b.

Data programmed in the storage node layer 140 may be erased by also charge tunneling through the blocking insulating layer 150. The erasing operation may be performed by applying a positive erase voltage to the control gate electrode

160. The semiconductor substrate 105 may be grounded such that the data locally stored in the storage node layer may be simultaneously erased.

The electric field and voltage characteristics of semiconductor memory devices according to example embodiments may be explained with reference to FIGS. 5 through 12. FIGS. 5 through 12 illustrate simulation results of experiments performed under various conditions. In FIGS. 5 through 12, a first region A may represent a blocking insulating layer 150, a second region B may represent a storage node layer 140, and a third region C may represent a tunneling insulating layer 130. In FIGS. 5 through 12, the blocking insulating layer 150 may be a silicon oxide layer having a dielectric constant of approximately 3.9, and the storage node layer 140 may be a silicon nitride layer. In FIGS. 5 through 8, the tunneling insulating layer 130 may be a silicon oxide layer having a dielectric constant of approximately 3.9. In FIGS. 9 through 12, the tunneling insulating layer 130 may be a high-k dielectric layer having a dielectric constant of approximately 10.

FIGS. 5 through 12 illustrate the electric field and voltage characteristics when a positive erase voltage is applied to the control gate electrode 160 (which is different only in sign from when a negative program voltage is applied to the control gate electrode 160). FIGS. 5, 6, 9, and 10 illustrate the electric field and voltage characteristics when the first and second channel regions 110a and 110b are grounded. FIGS. 7, 8, 11, and 12 illustrate the electric field and voltage characteristics when a channel boosting voltage (e.g., 3 V) is applied to the first and second channel regions 110a and 110b.

Referring to FIGS. 5 through 12, the electric field E in the blocking insulating layer 150 is greater than the electric field E in the tunneling insulating layer 130. In general, an electric field E of approximately 8 to 10 MV/cm may be required to tunnel charges. However, the electric field E in the tunneling insulating layer 130 may only be about 3 to 4 MV/cm, thereby making it more difficult to tunnel charges through the tunneling insulating layer 130, thus making it more difficult to perform the programming and erasing operations of the semiconductor memory device through the tunneling insulating layer 130.

Referring to FIGS. 5, 6, 9, and 10, the electric field E in the blocking insulating layer 150, however, may be about 6 to 9 MV/cm, thereby making it more feasible to tunnel charges through the blocking insulating layer 150. In this case, the voltage applied to the control gate electrode 160 may only be about 7 to 8 V, which is less than the 15 to 20 V that may be required by a conventional planar semiconductor memory device, thereby making it more feasible to perform the programming and erasing operations of the semiconductor memory device at a low voltage.

Referring to FIGS. 7, 8, 11, and 12, the electric field E in the blocking insulating layer 150 may be effectively reduced by channel boosting. The electric field E in the blocking insulating layer 150 may be reduced to approximately 3.5 to 6 V/cm by channel boosting, thereby making it more difficult to tunnel charges through the blocking insulating layer 150, thus preventing or reducing undesired programming and erasing operations.

Accordingly, the method of operating the semiconductor memory device according to example embodiments may perform programming and erasing operations at a low voltage using charge tunneling through the blocking insulating layer 150 and may prevent or reduce back tunneling through the tunneling insulating layer 130, thereby enhancing reliability of the programming and erasing operations of the semiconductor memory device.

Figure 3:
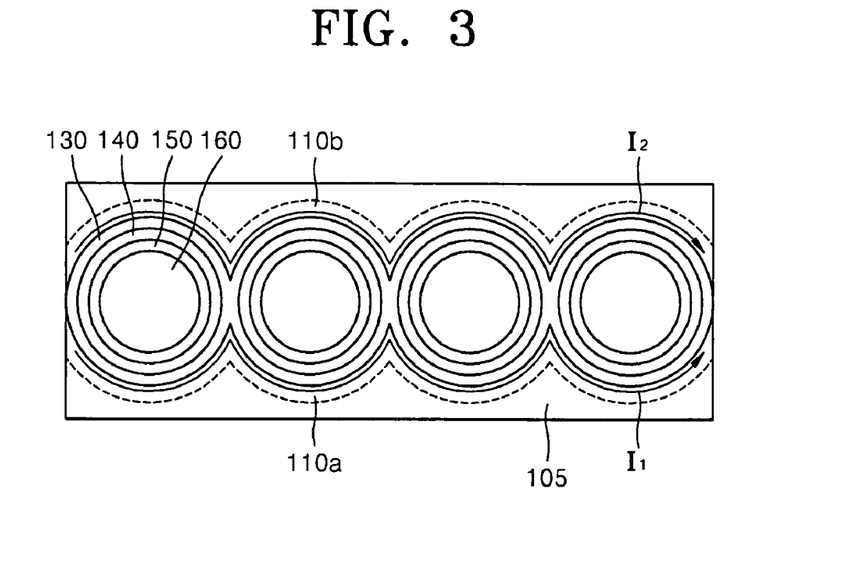
FIG. 3 is a plan view of another semiconductor memory device according to example embodiments.
Figure 4:
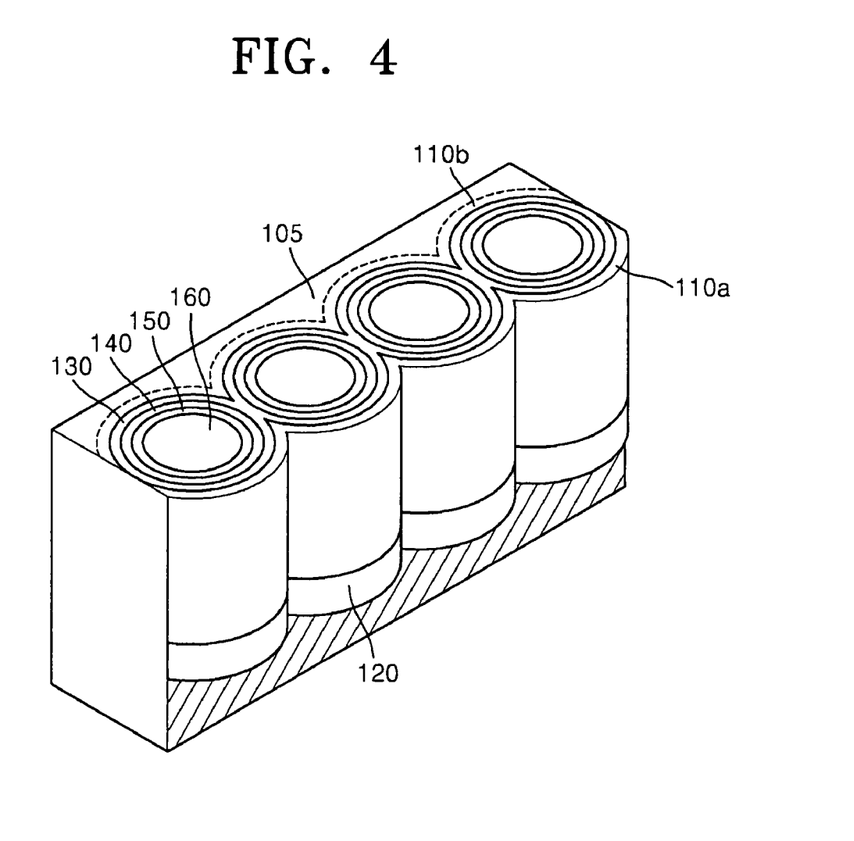
FIG. 4 is a partial cutaway perspective view of the semiconductor memory device of FIG. 3.
Figure 5:
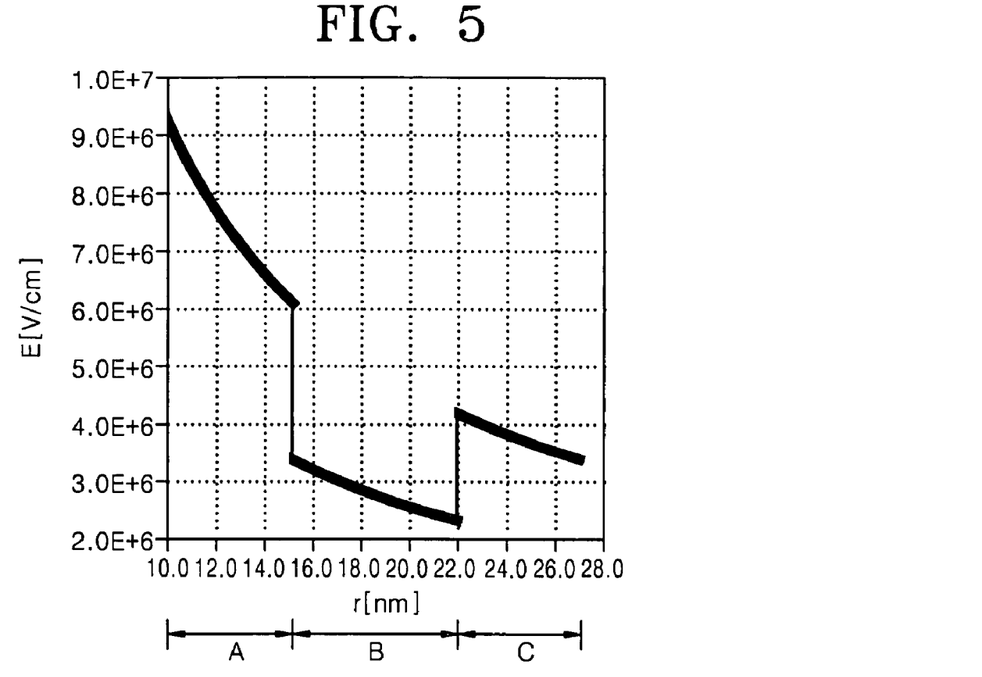
FIG. 5 is a graph illustrating the electric field distribution of a method of operating a semiconductor memory device according to example embodiments pursuant to an experiment.
Figure 6:
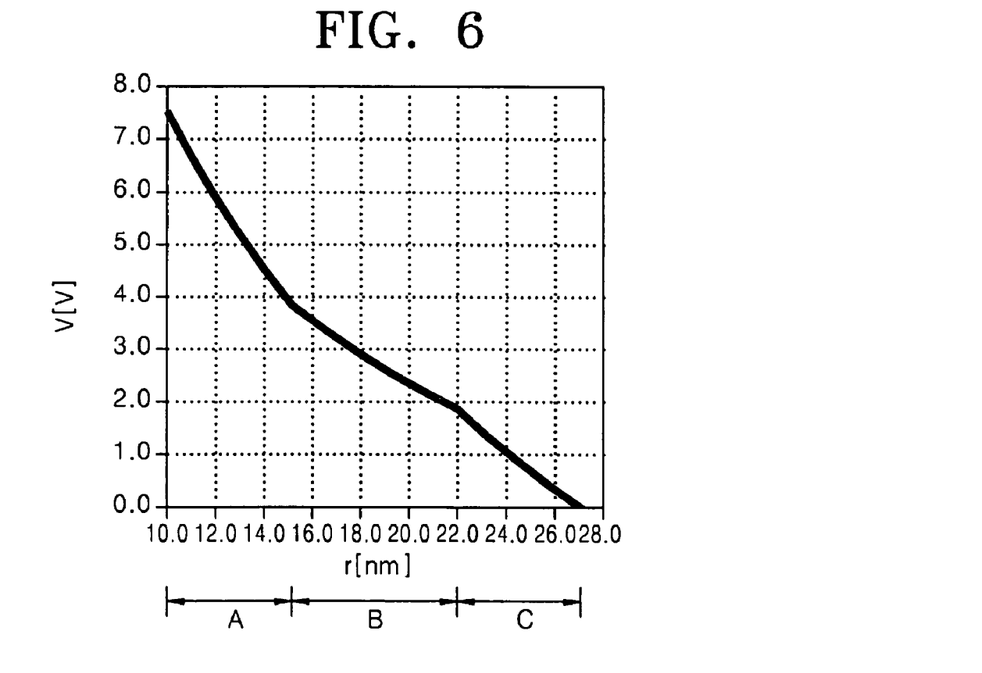
FIG. 6 is a graph illustrating the voltage distribution of the method of FIG. 5.
Figure 7:
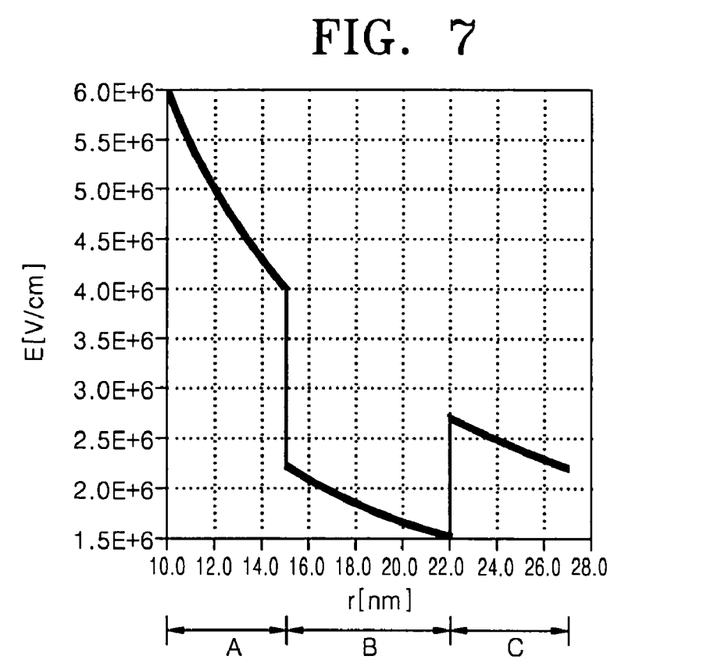
FIG. 7 is a graph illustrating the electric field distribution of a method of operating a semiconductor memory device according to example embodiments pursuant to another experiment.
Figure 8:
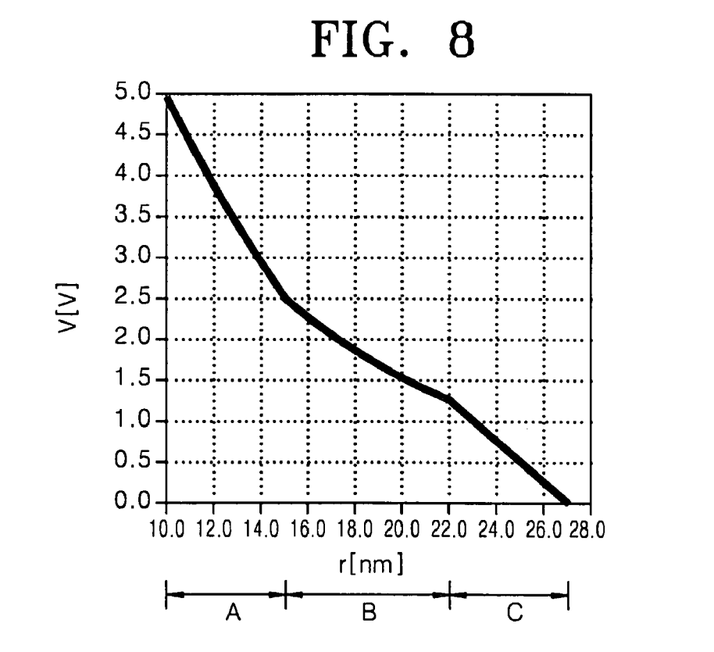
FIG. 8 is a graph illustrating the voltage distribution of the method of FIG. 7.
Figure 9:
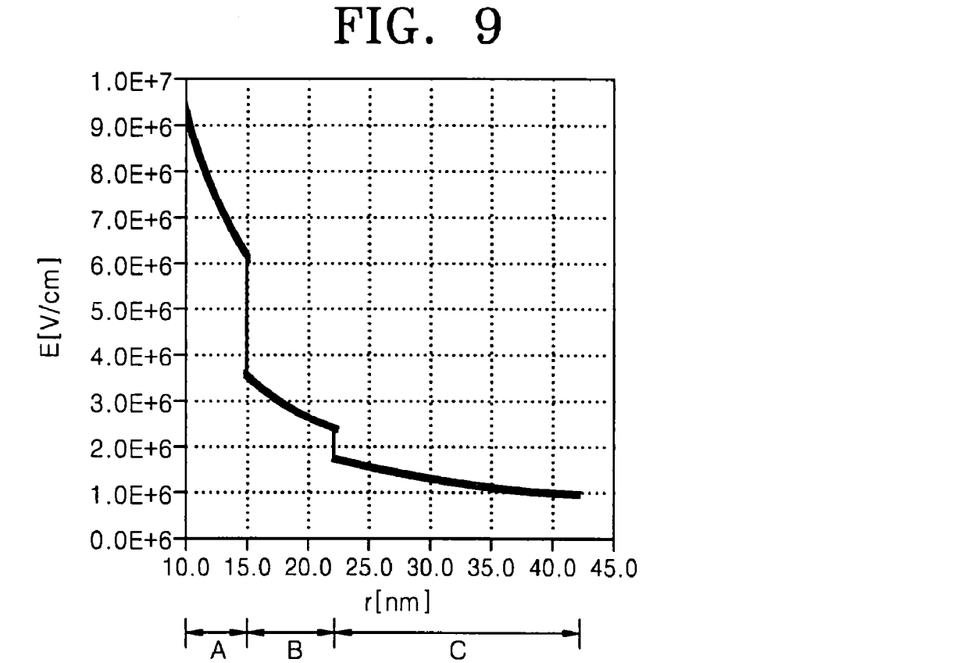
FIG. 9 is a graph illustrating the electric field distribution of a method of operating a semiconductor memory device according to example embodiments pursuant to another experiment.
Figure 10:
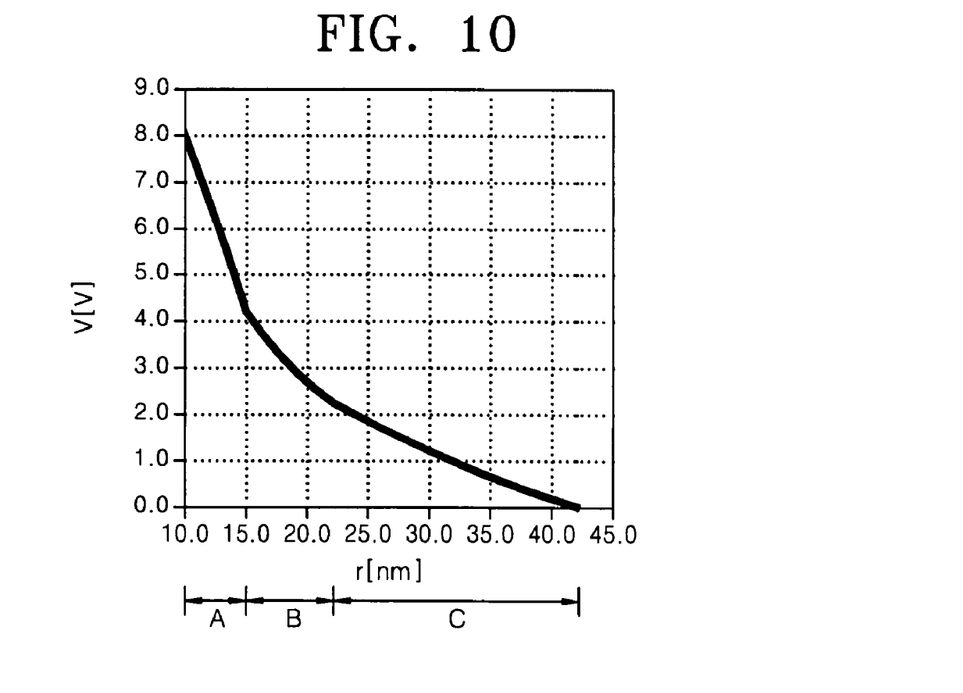
FIG. 10 is a graph illustrating the voltage distribution of the method of FIG. 9.
Figure 11:
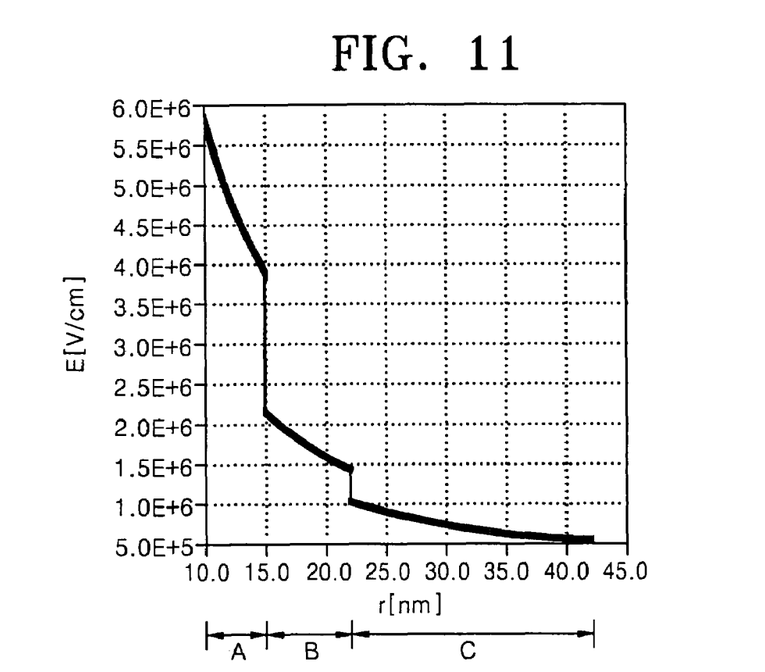
FIG. 11 is a graph illustrating the electric field distribution of a method of operating a semiconductor memory device according to example embodiments pursuant to yet another experiment.
Figure 12:
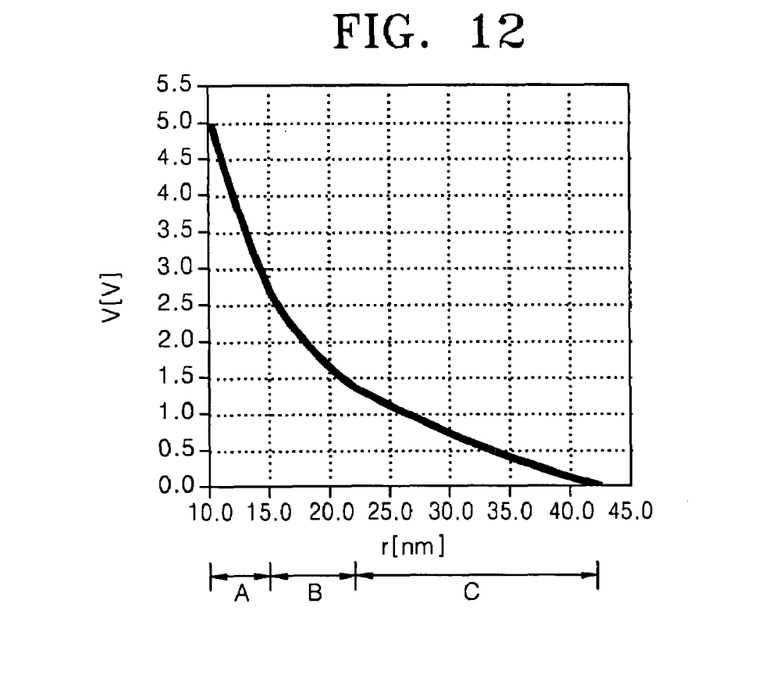
FIG. 12 is a graph illustrating the voltage distribution of the method of FIG. 11.

FIG. 3 is a plan view of another semiconductor memory device according to example embodiments. FIG. 4 is a partial cutaway perspective view of the semiconductor memory device of FIG. 3. The semiconductor memory device of FIGS. 3 and 4 may be configured such that a plurality of unit cells (each of which may be constructed like the semiconductor memory device of FIGS. 1 and 2) may be connected in a negative AND (NAND) arrangement. The same reference numerals in FIGS. 1 through 4 denote the same elements.

Referring to FIGS. 3 and 4, a plurality of control gate electrodes 160, a plurality of blocking insulating layers 150, and a plurality of storage node layers 140 may be separately formed in a plurality of unit cells. Adjacent tunneling insulating layers 130 of a plurality of tunneling insulating layers 130 may contact each other such that all of the tunneling insulating layers 130 are connected to each other in a string. Accordingly, a semiconductor substrate 105 may be divided into a first region on one side of the tunneling insulating layer 130 and a second region on the other side of the tunneling insulating layer 130.

As illustrated in FIGS. 3 and 4, the tunneling insulating layers 130 of the adjacent unit cells may directly contact and/or overlap one another. Thus, the contact portions between the tunneling insulating layers 130 of adjacent unit cells may act as the separating insulating layers 125a and 125b of FIGS. 1 and 2. Alternatively, the separating insulating layers 125a and 125b of FIGS. 1 and 2 may be interposed between the tunneling insulating layers 130.

Similar to the tunneling insulating layers 130, first and second channel regions 110a and 110b of adjacent unit cells may be connected to one another. Accordingly, the first channel regions 110a of the unit cells may be connected to one another without separate source and drain regions such that a first current $I_1$ may flow through the first channel regions 110a. Likewise, the second channel regions 110b of the unit cells may be connected to one another without separate source and drain regions such that a second current $I_2$ may flow through the second channel regions 110b. The first and second channel regions 110a and 110 may be symmetrical to each other.

The first and second channel regions 110a and 110b of the unit cells may be connected without separate source and drain regions, because the control gate electrodes 160 have radial electric fields. Accordingly, the semiconductor memory device of FIGS. 3 and 4 may have a NAND structure without source and drain regions, thereby occupying a smaller area than a conventional NAND-type semiconductor memory device. Therefore, the semiconductor memory device of FIGS. 3 and 4 may have higher integration density than its conventional counterpart. Additionally, the semiconductor memory device of FIGS. 3 and 4 may process 2-bit data in a single level operation while occupying a relatively small area, thereby achieving relatively high operating speed.

While a string of four unit cells are shown in FIGS. 3 and 4, example embodiments are not limited thereto. The semiconductor memory device according to example embodiments may have one or more NAND strings, and the number of unit cells in the one or more NAND strings may be properly determined depending on the case and use.

For the operation of the semiconductor memory device of FIGS. 3 and 4, the description with regard to FIGS. 5 through 12 may be referred to. One or more unit cells in or from which data is to be programmed or erased may be selected depending on the case and use. The data may be programmed or erased in or from the selected unit cells by charge tunnelling through the blocking insulating layer 150, as described above with reference to FIGS. 5 through 12.

As described above, the method of operating the semiconductor memory device according to example embodiments may enable the processing of 2-bit data in a single level operation and may increase an operating current by controlling the vertical depth of the channel regions, thereby increasing the operating speed of the semiconductor memory device.

Furthermore, the method of operating the semiconductor memory device according to example embodiments may perform data programming and erasing operations at a relatively low voltage by charge tunnelling through the blocking insulating layer, thereby improving the reliability of the programming and erasing operations of the semiconductor memory device.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A method of operating a semiconductor memory device, comprising:
    providing a semiconductor memory device including
        a semiconductor substrate;
        a control gate electrode recessed in the semiconductor substrate, wherein the control gate electrode has a cylindrical shape;
        a storage node layer between the control gate electrode and the semiconductor substrate;
        a tunneling insulating layer between the storage node layer and the semiconductor substrate;
        a blocking insulating layer between the storage node layer and the control gate electrode; and
        first and second channel regions surrounding the control gate electrode and separated by a pair of opposing separating insulating layers; and
    programming data in the storage node layer by charge tunneling through the blocking insulating layer.

2. The method of claim 1, wherein programming the data includes applying a negative program voltage to the control gate electrode.

3. The method of claim 2, wherein applying the negative program voltage includes grounding one of the first and second channel regions.

4. The method of claim 3, wherein applying the negative program voltage further comprises:
    applying a channel boosting voltage to the channel region that is not grounded.

5. The method of claim 1, further comprising:
    erasing the data programmed in the storage node layer by charge tunneling through the blocking insulating layer.

6. The method of claim 5, wherein erasing the data includes applying a positive erase voltage to the control gate electrode.

7. The method of claim 1, wherein the semiconductor memory device further comprises:
    a buried insulating layer between the bottom of the control gate electrode and the semiconductor substrate, the buried insulating layer having a thickness greater than the thickness of the tunneling insulating layer.

8. The method of claim 1, wherein the storage node layer includes at least one of a polysilicon layer, a silicon nitride layer, metal or silicon dots, and metal or silicon nano-crystals.

9. The method of claim 1, wherein the tunneling insulating layer has a dielectric constant equal to or greater than the dielectric constant of the blocking insulating layer.

10. A method of operating a semiconductor memory device, comprising:
    providing a semiconductor memory device including
        a semiconductor substrate;
        a plurality of control gate electrodes recessed in the semiconductor substrate, wherein one or more of the plurality of control gate electrodes have a cylindrical shape;
        a plurality of storage node layers between the plurality of control gate electrodes and the semiconductor substrate;
        a plurality of tunneling insulating layers between the plurality of storage node layers and the semiconductor substrate, wherein adjacent tunneling insulating layers contact each other;
        a plurality of blocking insulating layers between the plurality of storage node layers and the plurality of control gate electrodes; and
        first and second channel regions surrounding the plurality of control gate electrodes; and
    programming data in the plurality of storage node layers by charge tunneling through the plurality of blocking insulating layers.

11. The method of claim 10, wherein programming the data includes applying a negative program voltage to the plurality of control gate electrodes.

12. The method of claim 11, wherein applying the negative program voltage includes grounding one of the first and second channel regions.

13. The method of claim 12, wherein applying the negative program voltage further comprises:
    applying a channel boosting voltage to the channel region that is not grounded.

14. The method of claim 10, further comprising:
    erasing the data programmed in the plurality of storage node layers by charge tunneling through the plurality of blocking insulating layers.

15. The method of claim 14, wherein erasing the data includes applying a positive erase voltage to the plurality of control gate electrodes.

16. The method of claim 10, wherein the semiconductor memory device further comprises:
    a plurality of buried insulating layers between the bottoms of the plurality of control gate electrodes and the semiconductor substrate, each of the plurality of buried insulating layers having a thickness greater than the thickness of each of the plurality of tunneling insulating layers.

17. The method of claim 10, wherein one or more of the plurality of storage node layers includes at least one of a polysilicon layer, a silicon nitride layer, metal or silicon dots, and metal or silicon nano-crystals.

18. The method of claim 10, wherein one or more of the plurality of tunneling insulating layers has a dielectric constant equal to or greater than the dielectric constant of one or more of the plurality of blocking insulating layers.

19. The method of claim 1, wherein the tunneling insulating layer surrounds a curved surface of the cylindrical shape of the control gate electrode.

20. A method of operating a semiconductor memory device, comprising:
- providing a semiconductor memory device having
  - a control gate electrode recessed in a semiconductor substrate, the control gate electrode having a cylindrical body;
  - a blocking insulating layer, a storage node layer, and a tunneling insulating layer between the control gate electrode and the semiconductor substrate; and
  - first and second channel regions surrounding the control gate electrode and separated by a pair of insulating layers; and
- programming data in the storage node layer by charge tunneling through the blocking insulating layer.

* * * * *